United States Patent
Buehler et al.

(10) Patent No.: US 6,822,868 B2
(45) Date of Patent: Nov. 23, 2004

(54) HEAT SINK WITH INTEGRATED ELECTRONICS

(75) Inventors: David P. Buehler, Delphi, IN (US); Daniel A. Lawlyes, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 42 days.

(21) Appl. No.: 10/082,273

(22) Filed: Feb. 26, 2002

(65) Prior Publication Data

US 2003/0161106 A1 Aug. 28, 2003

(51) Int. Cl.[7] .................................................. H05K 7/20
(52) U.S. Cl. ...................... 361/704; 361/679; 361/689; 361/734; 361/690; 361/816; 439/485; 174/16.3; 318/139
(58) Field of Search ................................. 257/687, 787, 257/704, 706, 707, 713, 710; 174/52, 2; 361/752, 717–720, 704, 705, 707, 709–712; 165/80.3, 185

(56) References Cited

U.S. PATENT DOCUMENTS

| | | | |
|---|---|---|---|
| 4,717,990 A | * 1/1988 | Tugcu | 361/816 |
| 4,792,878 A | * 12/1988 | Buselmeier et al. | 361/690 |
| 4,812,897 A | * 3/1989 | Narita et al. | 174/253 |
| 5,065,277 A | * 11/1991 | Davidson | 361/689 |
| 5,641,713 A | * 6/1997 | Kyle | 156/330 |
| 5,703,754 A | * 12/1997 | Hinze | 361/736 |
| 5,926,373 A | * 7/1999 | Stevens | 361/704 |
| 5,930,113 A | * 7/1999 | McCann | 361/704 |
| 6,028,770 A | * 2/2000 | Kerner et al. | |
| 6,407,925 B1 | * 6/2002 | Kobayashi et al. | 361/752 |
| 6,422,307 B1 | 7/2002 | Bhatti et al. | |
| 6,424,531 B1 | 7/2002 | Bhatti et al. | |
| 6,432,253 B1 | * 8/2002 | Chung | 156/295 |
| 6,591,897 B1 | 7/2003 | Bhatti et al. | |
| 6,619,556 B1 | 9/2003 | Snider et al. | |

\* cited by examiner

*Primary Examiner*—Michael Datskovsky
(74) *Attorney, Agent, or Firm*—Jimmy L. Funke; Stefan V. Chmielewski

(57) ABSTRACT

A heat sink with integrated electronics having a cavity with one or more facing sides. Hybrid circuits are housed in the cavities. A bottom portion seals the housing and has a row of pins is provided for interconnecting the circuits housed in the separate cavities to an external device, thereby allowing the integration of different types of circuits in a single, fully enclosed, yet partitioned, housing.

22 Claims, 2 Drawing Sheets

HEAT SINK WITH INTEGRATED ELECTRONICS

TECHNICAL FIELD

The present invention relates to integrated circuits and more particularly to packaging multiple substrate technologies within a housing.

BACKGROUND OF THE INVENTION

Integrated circuits requiring a particular substrate technology, i.e. printed circuit boards, typically have manufacturing and assembly requirements that differ dramatically. For example, a thick film ceramic substrate is significantly different from a printed circuit board, making it difficult to combine the use of these two very different substrate technologies into a single, convenient, and cost effective package. Furthermore, certain unpackaged die and flip-chip technologies, called hybrid circuits, also have substrate technologies that differ from one another.

Many applications such as engine controller applications often require the integration of many different substrate technologies into a single application. For example, electronics associated with controlling an engine have sensitive micro-electronics requiring assembly to a printed circuit board that typically occurs within a clean room, be integrated with more durable devices, such as output driver circuits that are implemented with flip-chips on thick film ceramic substrates. The latter requiring a heat sink for heat removal from the power dissipating circuitry It is typical for integrated circuit applications to have strict space and weight constraints that make packaging an important factor in the overall system design. Often, the integration of different types of circuitry results in redundant integrated circuit and driver packaging, which increases overall circuit density and uses up valuable packaging space. The disadvantages include increased complexity, high cost, and an increase in the risk of poor reliability.

There is a need for a packaging strategy that enables interconnection of different substrate material technologies without the disadvantages associated with the prior art.

SUMMARY OF THE INVENTION

It is an object of the present invention to provide a strategy for partitioned packaging of multiple substrates in a single, enclosed housing. It is another object of the present invention to integrate multiple circuits having different substrate technologies into a single housing. Yet another object of the present invention is to include a heat sink in the partitioned housing. A further object of the present invention is to eliminate the need for redundant integrated circuit packaging.

The present invention provides a partitioned packaging strategy that enables interconnection of different substrate technologies into a single housing. The housing assembly utilizes vertical space for packaging. A heat sink is provided for removal of heat. At the same time, sensitive electronics can be fully enclosed and isolated from other more durable electronics, thereby eliminating the need to fully assemble the integrated circuit in an expensive clean room environment.

According to the present invention there is provided a housing, preferably cast aluminum, having a cavity in one or more facing sides. Hybrid circuits, and specifically ceramic-based hybrid circuits, are housed in the cavities. A bottom portion seals the housing and has a row of pins provided for interconnecting the circuits housed in the separate cavities, thereby allowing the integration of different types of circuits in a single, fully enclosed, yet partitioned, housing. Further, the housing itself can be connected to another device such as a printed circuit board. Thereby providing interconnection between the hybrid assemblies within the housing and other external devices.

In one embodiment of the present invention, a high temperature plastic is used for the housing cover, and cast aluminum is used for providing heat sink properties. The heat sink may further be mechanically mounted to a printed wiring board and to the housing, thereby completing a thermal path for drawing heat away from the circuitry.

In yet another embodiment of the present invention, a cover may enclose the entire housing, or portions thereof, to isolate and protect sensitive circuits from the surrounding environment. This provides the advantage of sealing and testing the assembly for subsequent shipping to a remote site, where the housing can be integrated into the product being assembled in a less controlled assembly environment.

Other objects and features of the present invention will become apparent when viewed in light of the detailed description of the preferred embodiment when taken in conjunction with the attached drawings and appended claims.

BRIEF DESCRIPTION OF THE DRAWINGS

In order that the present invention may be well understood, there will now be described some embodiments thereof, given by way of example, with reference to the accompanying drawings, in which.

DESCRIPTION OF THE PREFERRED EMBODIMENT

Figure 1:
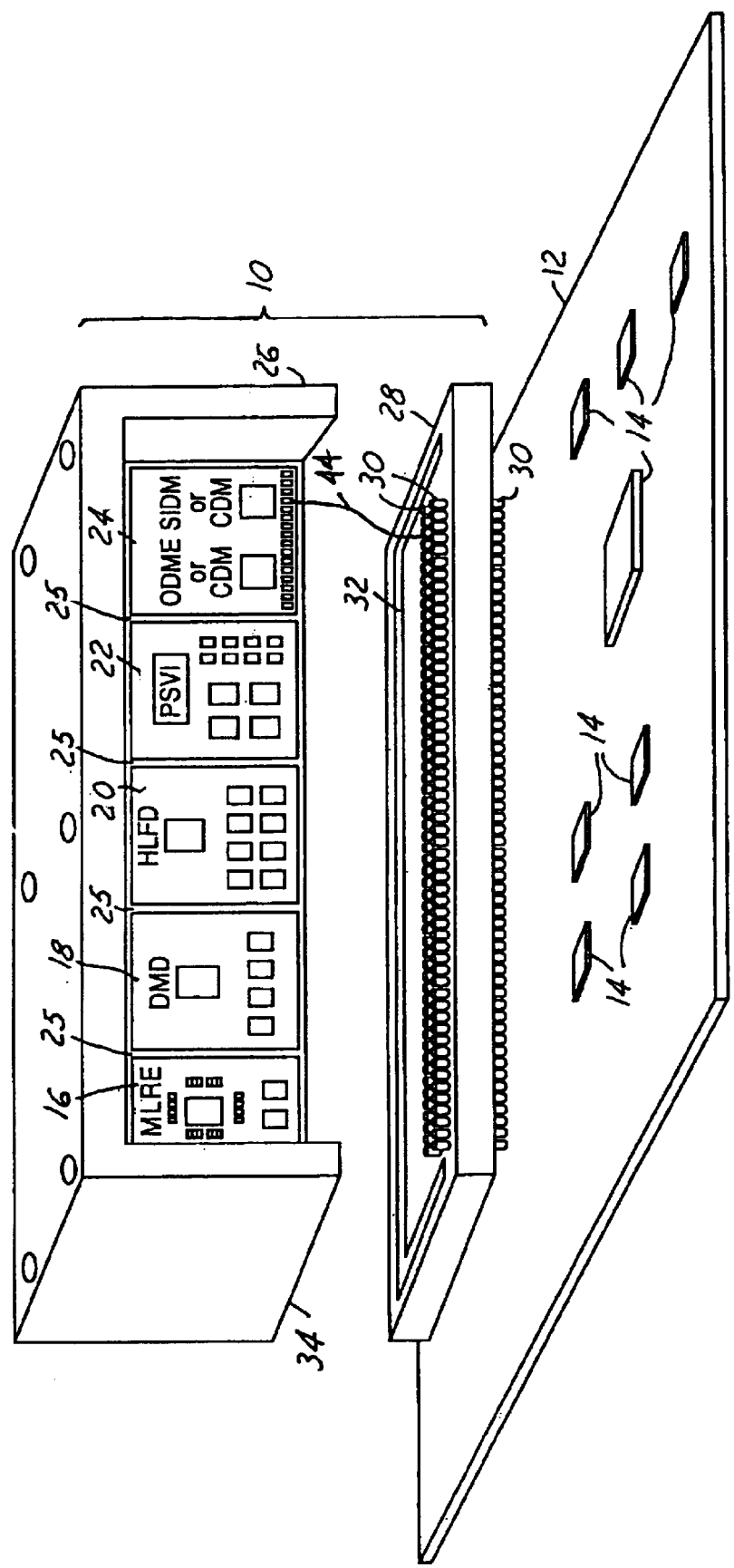
FIG. 1 is an exploded view of the integrated heat rail assembly of the present invention.

FIG. 1 is an exploded view of the integrated heat rail assembly 10 of the present invention, as it would be used in conjunction with a printed circuit board 12. The printed circuit board 12 has integrated circuit chips 14 mounted thereto and are typically used for circuits that require fine line, multi-layer, high-density interconnections for devices such as microcomputers. The boards can be implemented with copper-clad, glass epoxy laminate for example.

The present invention 10 houses a plurality of peripheral components 16, 18, 20, 22 and 24. While five are shown in FIG. 1, it is possible to implement the present invention using fewer, or more components depending on the specific application. The peripheral components are implemented in any one of a variety of substrate materials. For the example shown in FIG. 1, the application is a power switching circuit in which the peripheral component circuits 16–24 are implemented-with die and flip chips on thick film ceramic. However, it should be noted that each component circuit 16, 18, 20, and 22 may have a different substrate from each other.

The housing 10 has a bottomless cover 26, which is made of a material having the capability of withstanding high temperatures, preferably cast aluminum for heat sink capabilities. Cover 26 houses the component circuits 16–24. The cover 26 may or may not be partitioned 25 to house the component circuits 16–24. The substrates for the components 16, 18, 20 and 22 are usually thermally conductive substrates, therefore the cover 26 should have heat sink capabilities. The fourth, and bottom side 28 of the housing 10 is a high temperature plastic material having at least one row of pins 30 molded therein. The pins 30 provide interconnect capabilities between the peripheral components 16–24 and the printed circuit board 12. The pins should preferably be wire bond 44 compatible for connection to the peripheral component circuits 16–24 inside the cover 26 and solderable externally for interconnection to the printed circuit board. The housing 10 is preferably mechanically mounted to the printed circuit board.

The bottom section 28 of the housing 10 is made from a material having heat sink capabilities, preferably molded from a high heat plastic. A raised bead, or track 32 is molded around the periphery of the bottom section 28 for being received by a groove 34 cast in the heat sink cover 26. An adhesive (not shown) may be applied in the groove 34 to attach and seal the bottom section 28 to the cover 26, further protecting the sensitive components from the external environment.

The pins 30 that are molded into the bottom section 28, allow ease in assembly when the housing 10 is attached to another device such as the printed circuit board shown in FIG. 1. A sealed and pre-tested heat sink assembly may be shipped to remote sites and integrated in the product being assembled in a less controlled environment.

Figure 2:
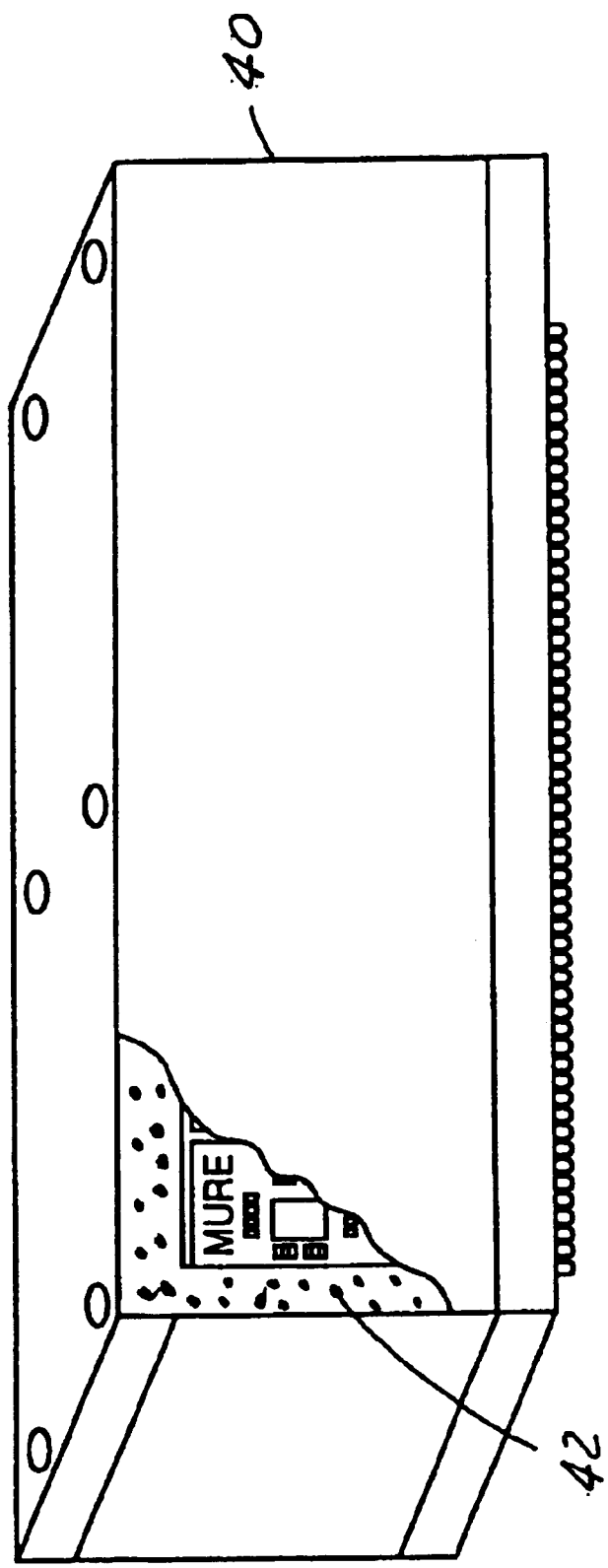
FIG. 2 is an isometric view of another embodiment of the integrated heat rail assembly of the present invention.

In another embodiment of the present invention, shown in FIG. 2, the housing 40 fully encloses the peripheral components (not shown) and is filled with a dielectric gel 42.

While particular embodiments of the invention have been shown and described, numerous variations and alternate embodiments will occur to those skilled in the art. Accordingly, it is intended that the invention be limited only in terms of the appended claims.

What is claimed is:

1. A heat sink assembly with integrated electronics comprising:
   a cover having at least one side open for exposing an interior cavity, said cover being made of a material having the capability of withstanding high temperatures;
   at least one hybrid circuit housed in said cavity and having interconnects at said open side of said cover; and
   a bottom for attachment to and sealing of said at least one open side of said cover, said bottom being made from a material having heat sink capabilities and having a plurality of interconnect pins molded therein, said pins providing electrical interconnect capabilities between said at least one hybrid circuit and an external device, said pins being coupled to said interconnects of said at least one hybrid circuit by a wire bond.

2. The heat sink assembly as claimed in claim 1 wherein said cover further comprises a track molded in an edge of said open side, and wherein said bottom has a bead molded therein for interconnection with said track in said open side of said cover.

3. The heat sink assembly as claimed in claim 2 wherein an adhesive is applied to said track thereby sealing said bottom to said cover.

4. The heat sink assembly as claimed in claim 1 wherein said cover is cast aluminum.

5. The heat sink assembly as claimed in claim 1 wherein said pins are solderable at another end for connection to said external device.

6. The heat sink assembly as claimed in claim 1 wherein said sealed cover and bottom are filled with a dielectric gel material.

7. The heat sink assembly as claimed in claim 1 wherein said cover has partitions separating said at least one hybrid circuit from another hybrid circuit housed in said cover, said at least one hybrid circuit and said another hybrid circuit having separate substrates.

8. The heat sink assembly as claimed in claim 1, wherein said at least one hybrid circuit is oriented substantially perpendicular to a plane defined by a face of said bottom, said face being attached to said cover.

9. A heat sink assembly with integrated electronics comprising:
   a cover having at least one side open for exposing an interior cavity, said cover being made of a material having the capability of withstanding high temperatures, said cover including a track molded in an edge of said open side;
   at least one hybrid circuit housed in said cavity and having interconnects at said open side of said cover; and
   a bottom for attachment to and sealing of said at least one open side of said cover, said bottom being made from a material having heat sink capabilities and having a plurality of interconnect pins molded therein, said pins providing electrical interconnect capabilities between said at least one hybrid circuit and an external device, said pins being coupled to said interconnects of said at least one hybrid circuit by a wire bond, said bottom having a bead molded therein for interconnection with said track in said open side of said cover.

10. The heat sink assembly as claimed in claim 9 wherein an adhesive is applied to said track thereby sealing said bottom to said cover.

11. The heat sink assembly as claimed in claim 9 wherein said cover is cast aluminum.

12. The heat sink assembly as claimed in claim 9 wherein said pins are solderable at another end for connection to said external device.

13. The heat sink assembly as claimed in claim 9 wherein said sealed cover and bottom are filled with a dielectric gel material.

14. The heat sink assembly as claimed in claim 9 wherein said cover has partitions separating said at least one hybrid circuit from another hybrid circuit housed in said cover, said at least one hybrid circuit and said another hybrid circuit having separate substrates.

15. The heat sink assembly as claimed in claim 9, wherein said at least one hybrid circuit is oriented substantially perpendicular to a plane defined by a face of said bottom, said face being attached to said cover.

16. A heat sink assembly with integrated electronics comprising:
   a cover having at least one side open for exposing an interior cavity, said cover being made of a material having the capability of withstanding high temperatures;
   a first and second hybrid circuit housed in said cavity and having interconnects at said open side of said cover, said cover having partitions separating said first hybrid circuit from said second hybrid circuit housed in said cover, said first hybrid circuit and said second hybrid circuit having separate substrates; and
   a bottom for attachment to and sealing of said at least one open side of said cover, said bottom being made from a material having heat sink capabilities and having a plurality of interconnect pins molded therein, said pins providing electrical interconnect capabilities between said first hybrid circuit and an external device, said pins being coupled to said interconnects of said first hybrid circuit by a wire bond.

17. The heat sink assembly as claimed in claim 16 wherein said cover further comprises a track molded in an edge of said open side, and wherein said bottom has a bead molded therein for interconnection with said track in said open side of said cover.

18. The heat sink assembly as claimed in claim 16 wherein an adhesive is applied to said track thereby sealing said bottom to said cover.

19. The heat sink assembly as claimed in claim 16 wherein said cover is cast aluminum.

20. The heat sink assembly as claimed in claim 16 wherein said pins are solderable at another end for connection to said external device.

21. The heat sink assembly as claimed in claim 16 wherein said sealed cover and bottom are filled with a dielectric gel material.

22. The heat sink assembly as claimed in claim 16, wherein said first hybrid circuit is oriented substantially perpendicular to a plane defined by a face of said bottom, said face being attached to said cover.

* * * * *